(12) United States Patent
Murai et al.

(10) Patent No.: US 11,680,076 B2
(45) Date of Patent: Jun. 20, 2023

(54) TRIAZOLE SILANE COMPOUND, METHOD FOR SYNTHESIZING SAID COMPOUND AND USE THEREOF

(71) Applicant: SHIKOKU CHEMICALS CORPORATION, Kagawa (JP)

(72) Inventors: Takayuki Murai, Kagawa (JP); Miya Tanioka, Kagawa (JP); Shusaku Iida, Kagawa (JP); Masato Katsumura, Kagawa (JP); Noriaki Yamaji, Kagawa (JP); Takahito Imamine, Kagawa (JP); Masahiko Tsujino, Kagawa (JP); Hirohiko Hirao, Kagawa (JP)

(73) Assignee: SHIKOKU CHEMICALS CORPORATION, Kagawa (JP)

( * ) Notice: Subject to any disclaimer, the term of this patent is extended or adjusted under 35 U.S.C. 154(b) by 854 days.

(21) Appl. No.: 16/500,988

(22) PCT Filed: Apr. 5, 2018

(86) PCT No.: PCT/JP2018/014628
§ 371 (c)(1),
(2) Date: Oct. 4, 2019

(87) PCT Pub. No.: WO2018/186476
PCT Pub. Date: Oct. 11, 2018

(65) Prior Publication Data
US 2020/0031852 A1 Jan. 30, 2020

(30) Foreign Application Priority Data
Apr. 7, 2017 (JP) .............................. JP2017-077019

(51) Int. Cl.
| | | |
|---|---|---|
| *C07F 7/18* | (2006.01) | |
| *C09J 5/02* | (2006.01) | |
| *C09J 9/02* | (2006.01) | |
| *C09J 11/06* | (2006.01) | |
| *H01L 21/02* | (2006.01) | |
| *H01L 23/29* | (2006.01) | |
| *H01L 23/31* | (2006.01) | |
| *H01L 23/00* | (2006.01) | |
| *H05K 1/03* | (2006.01) | |
| *H05K 3/46* | (2006.01) | |

(52) U.S. Cl.
CPC .......... *C07F 7/1804* (2013.01); *C07F 7/1892* (2013.01); *C09J 5/02* (2013.01); *C09J 9/02* (2013.01); *C09J 11/06* (2013.01); *H01L 21/02118* (2013.01); *H01L 23/293* (2013.01); *H01L 23/3157* (2013.01); *H01L 24/19* (2013.01); *H05K 1/0346* (2013.01); *H05K 3/4676* (2013.01); *H05K 2203/0789* (2013.01); *H05K 2203/0793* (2013.01)

(58) Field of Classification Search
CPC ..................................................... C07F 7/1804
See application file for complete search history.

(56) References Cited

U.S. PATENT DOCUMENTS

2012/0021232 A1  1/2012  Hack et al.
2016/0368935 A1  12/2016  Miura et al.

FOREIGN PATENT DOCUMENTS

| CN | 105358563 | 2/2016 |
|---|---|---|
| JP | 2002-363189 | 12/2002 |
| JP | 2015-182969 | 10/2015 |
| TW | 201509953 | 3/2015 |
| WO | 2015/002158 | 1/2015 |

OTHER PUBLICATIONS

Cheng, W., et al. "SBA-15 supported triazolium-based ionic liquids as highly efficient and recyclable catalysts for fixation of CO2 with epoxides." Catalysis Today. (2013), vol. 200, pp. 117-124. (Year: 2013).*
Office Action dated Mar. 23, 2021 in corresponding Japanese Patent Application No. 2019-511309, with English Translation.
Office Action dated Aug. 26, 2020 in corresponding Indian Patent Application No. 201917040533.
Hearing Notice issued Jul. 6, 2021 in corresponding Indian Patent Application No. 201917040533.
International Search Report, dated Jul. 3, 2018 in corresponding International Patent Application No. PCT/JP2018/014628, with English language translation.
Office Action dated Dec. 7, 2020 in corresponding Taiwanese Patent Application No. 107112131, with English translation.
Chinese Office Action dated Nov. 3, 2021, in corresponding Chinese Patent Application No. 201880022161.7, with English Translation.
Korean Office Action dated Nov. 22, 2021, issued in corresponding Korean Patent Application No. 10-2019-7028765, with English Translation.

* cited by examiner

*Primary Examiner* — John S Kenyon
(74) *Attorney, Agent, or Firm* — Wenderoth, Lind & Ponack, L.L.P.

(57) ABSTRACT

The purpose of the present invention is to provide: a novel triazole silane compound and a method for synthesizing the same, and a silane coupling agent containing the triazole silane compound as a component; and a surface treatment solution, a surface treatment method, and a method for bonding two different materials, which use said triazole silane compound.

22 Claims, No Drawings

TRIAZOLE SILANE COMPOUND, METHOD FOR SYNTHESIZING SAID COMPOUND AND USE THEREOF

TECHNICAL FIELD

The present invention relates to a novel triazole silane compound, and a surface treatment solution using the triazole silane compound, a surface treatment method, and use thereof.

BACKGROUND ART

As a component of a silane coupling agent, a substance composed of an organic substance and silicon has been used. This substance has different kinds of functional groups in its molecule, and exhibits a function as an intermediary between organic materials and inorganic materials that are not normally compatible. Therefore, it is an essential agent for development and production of composite materials.

Patent Literature 1 proposes, as a component of a silane coupling agent used as a primer for bonding glass or metal to rubber, various substances having a structure where a nitrogen-containing heterocyclic ring such as triazole or thiadiazole is connected to a silyl group such as a trimethoxysilyl group or a triethoxysilyl group, through an organic group having a thioether (sulfide) bond or the like.

Patent Literature 2 proposes 1N-trimethoxysilylpropyl-1,2,4-triazole as a silane compound used as a corrosion inhibitor for aluminum and magnesium alloys.

PRIOR ART LITERATURE

Patent Literature

Patent Literature 1: JP-A-2002-363189
Patent Literature 2: US Patent Application Laid-Open No. 2012/0021232

SUMMARY OF INVENTION

Technical Problem

An object of the present invention is to provide a novel triazole silane compound, a synthesis method thereof, and a silane coupling agent containing the novel triazole silane compound as a component.

Also, it is an object to provide a surface treatment solution, a surface treatment method, and a bonding method of different materials, using the triazole silane compound.

Solution to Problem

As a result of intensive investigations to solve the problems described above, the present inventors have recognized that a novel triazole silane compound is able to be synthesized by reacting a triazole compound with a halogenated alkylsilane compound, and they have completed the present invention.

That is, the present invention encompasses the following (1) to (34).

[1] A triazole silane compound represented by the chemical formula (I).

[Chem. 1]

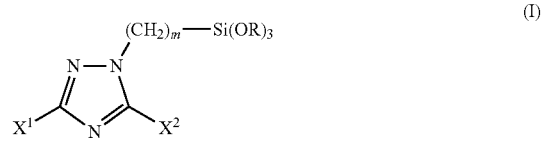
(I)

(in the formula, $X^1$ and $X^2$ are the same as or different from each other and each represents a hydrogen atom, a linear or branched alkyl group having a carbon number of 1 to 12, a phenyl group, a benzyl group, an amino group, or an alkylthio group having a carbon number of 1 to 6; m represents an integer of 1 to 12; R represents a methyl group or an ethyl group; provided that the case where $X^1$ and $X^2$ are simultaneously hydrogen atoms is excluded.)

[2] A synthesis method of the triazole silane compound described in the above [1], including reacting a triazole compound represented by the chemical formula (II) with a halogenated alkylsilane compound represented by the chemical formula (III).

[Chem. 2]

(II)

N—NH
X¹⟶⟵X²
    N (in the formula, $X^1$ and $X^2$ have the same meanings as described above.)

[Chem. 3]

$$Hal\text{-}(CH_2)_m\text{—}Si(OR)_3 \quad (III)$$

(in the formula, R and m have the same meanings as described above; and Hal represents a chlorine atom, a bromine atom or an iodine atom.)

[3] A silane coupling agent comprising a triazole silane compound represented by the following chemical formula (IV) as a component.

[Chem. 4]

(IV)

(in the formula, $X^1$ and $X^2$ are the same as or different from each other and each represents a hydrogen atom, a linear or branched alkyl group having a carbon number of 1 to 12, a phenyl group, a benzyl group, an amino group, or an alkylthio group having a carbon number of 1 to 6; m represents an integer of 1 to 12; n represents 0 or an integer of 1 to 3; R represents a methyl group or an ethyl group; provided that the case where $X^1$ and $X^2$ are simultaneously hydrogen atoms is excluded.)

[4] A surface treatment solution containing a triazole silane compound represented by the following chemical formula (IV).

[Chem. 5]

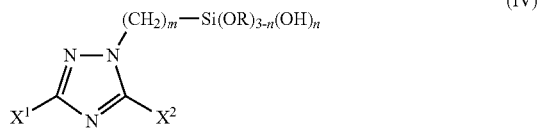

(in the formula, $X^1$ and $X^2$ are the same as or different from each other and each represents a hydrogen atom, a linear or branched alkyl group having a carbon number of 1 to 12, a phenyl group, a benzyl group, an amino group, or an alkylthio group having a carbon number of 1 to 6; m represents an integer of 1 to 12; n represents 0 or an integer of 1 to 3; R represents a methyl group or an ethyl group; provided that the case where $X^1$ and $X^2$ are simultaneously hydrogen atoms is excluded.)

[5] The surface treatment solution according to the above [4], which is used for treating a surface of at least one material selected from the group consisting of a metal, an inorganic material and a resin material.

[6] The surface treatment solution according to the above [4], which is used for bonding two materials selected from the group consisting of a metal, an inorganic material and a resin material.

[7] The surface treatment solution according to the above [5] or [6], in which the metal is at least one selected from the group consisting of copper, aluminum, titanium, nickel, tin, iron, silver, gold, and alloys thereof.

[8] The surface treatment solution according to the above [5] or [6], in which the metal is copper or a copper alloy.

[9] The surface treatment solution according to the above [5] or [6], in which the inorganic material is at least one selected from the group consisting of silicon, a ceramic and a glass.

[10] The surface treatment solution according to the above [9], in which the ceramic is at least one selected from the group consisting of alumina, silicon carbide, aluminum nitride, silicon nitride, and barium titanate.

[11] The surface treatment solution according to the above [5] or [6], in which the resin material is at least one selected from the group consisting of an acrylate resin, an epoxy resin, an olefin resin, a polybenzoxazole resin, a silicone resin, and a polyimide resin.

[12] A surface treatment method of metal, including bringing the surface treatment solution described in the above [4] into contact with a surface of a metal.

[13] The surface treatment method of metal according to the above [12], in which the metal is at least one selected from the group consisting of copper, aluminum, titanium, nickel, tin, iron, silver, gold, and alloys thereof.

[14] The surface treatment method of metal according to the above [12], in which the metal is copper or a copper alloy.

[15] The surface treatment method of metal according to the above [14], including, before bringing the surface treatment solution into contact with a surface of copper or a copper alloy, bringing an aqueous solution containing a copper ion into contact with the surface of the copper or the copper alloy.

[16] The surface treatment method of metal according to the above [14] or [15], including, after bringing the surface treatment solution into contact with a surface of copper or a copper alloy, bringing an aqueous acidic solution or an aqueous alkaline solution into contact with the surface of the copper or the copper alloy.

[17] A surface treatment method of an inorganic material, including bringing the surface treatment solution described in the above [4] into contact with a surface of an inorganic material.

[18] The surface treatment method of an inorganic material according to the above [17], in which the inorganic material is at least one selected from the group consisting of silicon, a ceramic and a glass.

[19] The surface treatment method of an inorganic material according to the above [18], in which the ceramic is at least one selected from the group consisting of alumina, silicon carbide, aluminum nitride, silicon nitride, and barium titanate.

[20] A surface treatment method of a resin material, including bringing the surface treatment solution described in the above [4] into contact with a surface of a resin material.

[21] The surface treatment method of a resin material according to the above [20], in which the resin material is at least one selected from the group consisting of an acrylate resin, an epoxy resin, an olefin resin, a polybenzoxazole resin, a silicone resin, and a polyimide resin.

[22] A bonding method between a metal and a resin material, including bringing the surface treatment solution described in the above [4] into contact with at least one of a metal and a resin material to form a chemical film on the at least one thereof, and bonding the metal and the resin material to each other through the chemical film.

[23] A bonding method between an inorganic material and a resin material, including bringing the surface treatment solution described in the above [4] into contact with at least one of an inorganic material and a resin material to form a chemical film on the at least one thereof, and bonding the inorganic material and the resin material to each other through the chemical film.

[24] A bonding method between a metal and an inorganic material, including bringing the surface treatment solution described in the above [4] into contact with at least one of a metal and an inorganic material to form a chemical film on the at least one thereof, and bonding the metal and the inorganic material to each other through the chemical film.

[25] A printed wiring board including two materials selected from the group consisting of a metal, an inorganic material and a resin material, bonded through a chemical film formed from the surface treatment solution described in the above [4].

[26] A semiconductor wafer including two materials selected from the group consisting of a metal, an inorganic material and a resin material, bonded through a chemical film formed from the surface treatment solution described in the above [4].

[27] An electronic device including two materials selected from the group consisting of a metal, an inorganic material and a resin material, bonded through a chemical film formed from the surface treatment solution described in the above [4].

[28] An insulating composition containing the silane coupling agent described in the above [3] and a resin material or an inorganic material.

[29] The insulating composition according to the above [28], in which the resin material is at least one selected from the group consisting of an acrylate resin, an epoxy resin, an olefin resin, a benzoxazole resin, a silicone resin, and a polyimide resin.

[30] The insulating composition according to the above [28], in which the inorganic material is at least one selected from the group consisting of silicon, a ceramic and a glass.
[31] An insulating material containing the insulating composition described in any one of the above [28] to [30].
[32] A printed wiring board containing an insulating layer obtained from the insulating composition described in any one of the above [28] to [30].
[33] A semiconductor wafer containing an insulating layer obtained from the insulating composition described in any one of the above [28] to [30].
[34] An electronic device containing an insulating layer obtained from the insulating composition described in any one of the above [28] to [30].

Advantageous Effects of Invention

The triazole silane compound of the present invention is a substance having a 1,2,4-triazole ring together with an alkoxysilyl group in the molecule, and thus can be expected to provide a silane coupling agent to which a function of preventing metal from rust, which is the feature of a triazole compound, and a function of curing an epoxy resin or a urethane resin are added, when used as a component.

Also, according to the surface treatment solution containing the triazole silane compound of the present invention, the bonding property between two materials different in the quality of material, specifically, between a metal and an inorganic material, between a metal and a resin material, and between an inorganic material and a resin material, can be enhanced.

DESCRIPTION OF EMBODIMENTS

The present invention will be described in detail hereinafter. Incidentally, the present invention is not limited to the embodiments to be described below.
(Triazole Silane Compound)
The triazole silane compound of the present invention is a triazole silane compound represented by the above-described chemical formula (I) (hereinafter sometimes referred to as triazole silane compound (I)), and examples thereof include:
3-methyl-1-[2-(triethoxysilyl)ethyl]-1,2,4-triazole,
5-methyl-1-[4-(trimethoxysilyl)butyl]-1,2,4-triazole,
3-ethyl-1-[3-(trimethoxysilyl)propyl]-1,2,4-triazole,
3-propyl-1-[3-(trimethoxysilyl)propyl]-1,2,4-triazole,
3-isopropyl-1-[10-(trimethoxysilyl)decyl]-1,2,4-triazole,
3-butyl-1-[3-(trimethoxysilyl)propyl]-1,2,4-triazole,
3-hexyl-1-[3-(trimethoxysilyl)propyl]-1,2,4-triazole,
5-methyl-3-octyl-1-[3-(trimethoxysilyl)propyl]-1,2,4-triazole,
3-dodecyl-1-[6-(triethoxysilyl)hexyl]-1,2,4-triazole,
3,5-dimethyl-1-[3-(trimethoxysilyl)propyl]-1,2,4-triazole,
3,5-diisopropyl-1-[3-(triethoxysilyl)propyl]-1,2,4-triazole,
3-phenyl-1-[3-(trimethoxysilyl)propyl]-1,2,4-triazole,
3-methyl-5-phenyl-1-[3-(trimethoxysilyl)propyl]-1,2,4-triazole,
3-ethyl-5-phenyl-1-[3-(trimethoxysilyl)propyl]-1,2,4-triazole,
3,5-diphenyl-1-[3-(triethoxysilyl)propyl]-1,2,4-triazole,
3-benzyl-1-[4-(triethoxysilyl)butyl]-1,2,4-triazole,
3-benzyl-5-phenyl-1-[3-(triethoxysilyl)propyl]-1,2,4-triazole,
3-hexylthio-1-[3-(triethoxysilyl)propyl]-1,2,4-triazole,
5-propyl-3-benzyl-1-[6-(triethoxysilyl)hexyl]-1,2,4-triazole,
3-amino-1-(triethoxysilyl)methyl-1,2,4-triazole,
3-amino-1-[2-(trimethoxysilyl)ethyl]-1,2,4-triazole,
3-amino-1-[3-(trimethoxysilyl)propyl]-1,2,4-triazole,
5-amino-1-[3-(triethoxysilyl)propyl]-1,2,4-triazole,
5-amino-3-ethyl-1-[6-(trimethoxysilyl)hexyl]-1,2,4-triazole,
3-amino-5-phenyl-1-[3-(triethoxysilyl)propyl]-1,2,4-triazole,
3-amino-5-benzyl-1-[3-(triethoxysilyl)propyl]-1,2,4-triazole,
3-amino-1-[6-(trimethoxysilyl)hexyl]-1,2,4-triazole,
3-amino-1-[6-(triethoxysilyl)hexyl]-1,2,4-triazole,
3-amino-1-[12-(trimethoxysilyl)dodecyl]-1,2,4-triazole,
3,5-diamino-1-[3-(trimethoxysilyl)propyl]-1,2,4-triazole,
3,5-diamino-1-[3-(triethoxysilyl)propyl]-1,2,4-triazole,
3,5-diamino-1-[6-(trimethoxysilyl)hexyl]-1,2,4-triazole,
3,5-diamino-1-[12-(trimethoxysilyl)dodecyl]-1,2,4-triazole,
3-methylthio-1-[3-(trimethoxysilyl)propyl]-1,2,4-triazole,
3-isopropylthio-1-[3-(trimethoxysilyl)propyl]-1,2,4-triazole,
3-hexylthio-1-[10-(triethoxysilyl)decyl]-1,2,4-triazole,
3-ethylthio-5-isopropyl-1-[3-(triethoxysilyl)propyl]-1,2,4-triazole,
3,5-bis(methylthio)-1-[3-(trimethoxysilyl)propyl]-1,2,4-triazole,
3-methylthio-5-hexylthio-1-[3-(trimethoxysilyl)propyl]-1,2,4-triazole,
3-amino-5-methylthio-1-[3-(triethoxysilyl)propyl]-1,2,4-triazole,
5-amino-3-methylthio-1-[3-(trimethoxysilyl)propyl]-1,2,4-triazole,
5-amino-3-methylthio-1-[3-(triethoxysilyl)propyl]-1,2,4-triazole,
5-amino-3-isopropylthio-1-[6-(triethoxysilyl)hexyl]-1,2,4-triazole,
3-amino-5-hexylthio-1-[3-(triethoxysilyl)propyl]-1,2,4-triazole, and the like.

The triazole silane compound of the present invention can be synthesized generally in a high yield by reacting the triazole compound represented by the above-described chemical formula (II) (hereinafter sometimes referred to as triazole compound (II)) with the halogenated alkylsilane compound represented by the above-described chemical formula (III) (hereinafter sometimes referred to as halogenated alkylsilane compound (III)) in the presence of a dehydrohalogenation agent in an appropriate amount of a reaction solvent at an appropriate reaction temperature for an appropriate reaction time (see Reaction Scheme (A)).

Reaction scheme (A)

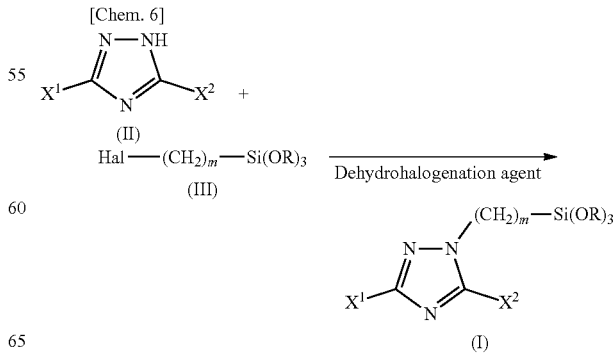

(in the formulae, $X^1$, $X^2$, R, Hal, and m have the same meanings as described above.)

Examples of the triazole compound (II) include:
3-methyl-1,2,4-triazole,
3-ethyl-1,2,4-triazole,
3-propyl-1,2,4-triazole,
3-isopropyl-1,2,4-triazole,
3-butyl-1,2,4-triazole,
3-hexyl-1,2,4-triazole,
3-dodecyl-1,2,4-triazole,
3,5-dimethyl-1,2,4-triazole,
3,5-diisopropyl-1,2,4-triazole,
3-ethyl-5-octyl-1,2,4-triazole,
5-methyl-3-octyl-1,2,4-triazole,
3-phenyl-1,2,4-triazole,
3-methyl-5-phenyl-1,2,4-triazole,
3-ethyl-5-phenyl-1,2,4-triazole,
3,5-diphenyl-1,2,4-triazole,
3-benzyl-1,2,4-triazole,
5-propyl-3-benzyl-1,2,4-triazole,
3-benzyl-5-phenyl-1,2,4-triazole,
3-amino-1,2,4-triazole,
3-amino-5-ethyl-1,2,4-triazole,
3-amino-5-phenyl-1,2,4-triazole,
3-amino-5-benzyl-1,2,4-triazole,
3,5-diamino-1,2,4-triazole,
3-methylthio-1,2,4-triazole,
3-ethylthio-5-isopropyl-1,2,4-triazole,
3-isopropylthio-1,2,4-triazole,
3-hexylthio-1,2,4-triazole,
3,5-bis(methylthio)-1,2,4-triazole,
3-methylthio-5-hexylthio-1,2,4-triazole,
3-amino-5-methylthio-1,2,4-triazole,
3-amino-5-isopropylthio-1,2,4-triazole,
3-amino-5-hexylthio-1,2,4-triazole, and the like.

Examples of the halogenated alkylsilane compound (III) includes:
1-chloromethyltrimethoxysilane,
1-chloromethyltriethoxysilane,
2-chloroethyltrimethoxysilane,
2-chloroethyltriethoxysilane,
3-chloropropyltrimethoxysilane,
3-chloropropyltriethoxysilane,
3-bromopropyltrimethoxysilane,
3-bromopropyltriethoxysilane,
3-iodopropyltrimethoxysilane,
3-iodopropyltriethoxysilane,
4-bromobutyltrimethoxysilane,
4-bromobutyltriethoxysilane,
5-bromopentyltrimethoxysilane,
5-bromopentyltriethoxysilane,
6-bromohexyltrimethoxysilane,
6-bromohexyltriethoxysilane,
8-bromooctyltrimethoxysilane,
8-bromo-octyltriethoxysilane,
10-bromo-decyltrimethoxysilane,
10-bromo-decyltriethoxysilane,
12-bromododecyltrimethoxysilane,
12-bromo-dodecyltriethoxysilane, and the like.

The reaction solvent is not particularly limited as long as it is a solvent inert to the triazole compound (II) and the halogenated alkylsilane compound (III), and examples thereof includes:
hydrocarbon solvents such as hexane, toluene and xylene;
ether solvents such as diethyl ether, tetrahydrofuran, dioxane, and cyclopentyl methyl ether;
ester solvents such as ethyl acetate and butyl acetate;
alcohol solvents such as methanol and ethanol;
amide solvents such as N,N-dimethylformamide, N,N-dimethylacetamide and N-methylpyrrolidone;
ketone solvents such as acetone, methyl ethyl ketone, methyl isobutyl ketone, and cyclohexanone; acetonitrile; dimethyl sulfoxide; hexamethylphosphoramide; and the like.

Examples of the dehydrohalogenation agent includes:
alkali metal alkoxides such as sodium methoxide, sodium ethoxide, potassium methoxide, and potassium tert-butoxide;
alkali carbonates such as sodium carbonate, sodium hydrogen carbonate and potassium hydrogen carbonate;
organic bases such as diazabicycloundecene;
sodium hydride; and the like.

The reaction between the triazole compound (II) and the halogenated alkylsilane compound (III) proceeds stoichiometrically as shown in the reaction scheme (A). And it is preferred that the use amount (charged amount) of the halogenated alkylsilane compound (III) to the use amount (charged amount) of the triazole compound (II) is set to an appropriate ratio in a range of from 0.8 to 1.2 times by mole in consideration of the factors such as the kinds of starting materials and reaction solvent used and the reaction scale, as well as the reaction temperature and the reaction time.

In the case where the charged amount of the halogenated alkylsilane compound (III) is larger than 1.2 times by mole, there is a possibility that the compound is polymerized to be gelled, whereas in the case of lower than 0.8 times by mole, there is a possibility that purity of the product is reduced or separation operation of the product becomes cumbersome.

Also, since the dehydrohalogenation agent is used for the purpose of neutralizing hydrogen halide by-produced in the reaction of the triazole compound (II) with the halogenated alkylsilane compound (DI), the use amount (charged amount) thereof may be equimolar or more to the use amount of the halogenated alkylsilane compound (III).

The reaction temperature is not particularly limited as long as it is in the temperature rage where NH at 1-position of the triazole compound (II) reacts with the halogenated alkylsilane compound (DI), and it is preferably in a range of from 0 to 150° C., and more preferably in a range of from 5 to 100° C.

The reaction time is appropriately determined according to the reaction temperature set, and it is preferably in a range of from 30 minutes to 10 hours, and more preferably in a range of from 1 to 8 hours.

(Silane Coupling Agent)

The silane coupling agent according to the present invention contains a triazole silane compound represented by the above-described chemical formula (IV) (hereinafter sometimes referred to as triazole silane compound (IV)) as a component.

At the time of using the silane coupling agent according to the present invention, a surface treatment method similar to that in the case of a conventional silane coupling agent can be adopted.

Examples of the surface treatment method includes: (a) a method of spray coating, on a base material, a surface treatment solution prepared by diluting an appropriate amount of the silane coupling agent with an organic solvent; (b) a method of spray coating, on a base material, a surface treatment solution prepared by diluting the silane coupling agent with water and an organic solvent; (c) a method of spray coating, on a base material, a surface treatment solution prepared by diluting the silane coupling agent with water; (d) a method of immersing a base material in a surface treatment solution prepared by diluting the silane coupling agent with an organic solvent; (e) a method of immersing a base material in a surface treatment solution prepared by diluting the silane coupling agent with water and an organic solvent; and (f) a method of immersing a base material in a surface treatment solution prepared by diluting the silane coupling agent with water.

Examples of the organic solvent includes:
hydrocarbon solvents such as benzene, toluene, xylene, heptane, hexane, cyclohexane, and n-octane; halogenated hydrocarbon solvents such as dichloromethane, dichloroethane, carbon tetrachloride, chloroform, chlorobenzene, dichlorobenzene, and trichlorobenzene;
ketone solvents such as acetone, methyl ethyl ketone and methyl isobutyl ketone;
ether solvents such as diethyl ether, tetrahydrofuran, dioxane, ethylene glycol monomethyl ether (methyl cellosolve), ethylene glycol monoethyl ether (ethyl cellosolve), ethylene glycol monobutyl ether, and diethylene glycol monobutyl ether;
alcohol solvents such as methanol, ethanol, 1-propanol, 2-propanol, n-butyl alcohol, 2-butyl alcohol, tert-butyl alcohol, ethylene glycol, diethylene glycol, and propylene glycol; and the like.

Examples of the base material used in the present invention includes: base materials having granular form, needle form, fibrous form, woven fabric form, plate form, foil form, amorphous form, and the like, made of a metal, an inorganic material, a resin material, and the like.

Examples of the metal includes: copper, aluminum, titanium, nickel, tin, iron, silver, gold, and alloys thereof, and a plate, foil, plating film and the like made of the metal can be used as the base material.

As to specific examples of the alloy, a copper alloy is not particularly limited as long as it is an alloy containing copper, and examples thereof includes: alloys of Cu—Ag based, Cu—Te based, Cu—Mg based, Cu—Sn based, Cu—Si based, Cu—Mn based, Cu—Be—Co based, Cu—Ti based, Cu—Ni—Si based, Cu—Zn—Ni based, Cu—Cr based, Cu—Zr based, Cu—Fe based, Cu—Al based, Cu—Zn based, Cu—Co based, and the like.

Also, examples of other alloys include aluminum alloys (Al—Si alloys), nickel alloys (Ni—Cr alloys), iron alloys (Fe—Ni alloys, stainless steel, steel), and the like.

Of these metals, copper and a copper alloy are preferred.

Examples of the inorganic material includes: silicon; ceramics; inorganic materials used as a filler; glass; and the like.

Specific examples thereof include: silicon; silicon compounds such as silicon carbide, silica, glass, a diatomaceous earth, calcium silicate, a talc, glass beads, a sericite activated white earth, bentonite, aluminosilicate salts, and mica; oxides such as alumina, zinc oxide, iron oxide, magnesium oxide, tin oxide, and titanium oxide; hydroxides such as magnesium hydroxide, aluminum hydroxide and basic magnesium carbonate; carbonates such as calcium carbonate, zinc carbonate, hydrotalcite, and magnesium carbonate; sulfates such as barium sulfate and gypsum; titanates such as barium titanate; nitrides such as aluminum nitride and silicon nitride; carbon fibers; and the like.

Of the inorganic materials, silicon, a ceramic (alumina, silicon carbide, aluminum nitride, silicon nitride, barium titanate, etc.) and glass are preferred.

Examples of the resin material include: Nylon, acrylate resins, epoxy resins, olefin resins, polybenzoxazole resins, silicone resins, polyimide resins, bismaleimide resins, maleimide resins, cyanate resins, polyphenylene ether resins, polyphenylene oxide resins, olefin resins, fluorine-containing resins, polyetherimide resins, polyether ether ketone resins, liquid crystal resins, and the like, and also include a combination thereof by mixing or modifying with each other.

Of these resin materials, acrylate resins, epoxy resins, olefin resins, polybenzoxazole resins, silicone resins, and polyimide resins are preferred.

In the case where such a surface treatment is applied to the base material, it is possible to improve affinity (bonding property, adhesion property) to resins and the like owing to increased lipophilicity of the surface of the base material.

In order to enhance the effect of the treatment, the surface-treated base material may be further subjected to a heat treatment.

(Surface Treatment Solution)
<Surface Treatment Solution Containing Triazole Silane Compound Represented by Chemical Formula (IV)>

The surface treatment solution of the present invention is a surface treatment solution containing the triazole silane compound (IV), and the triazole silane compound (IV) encompasses triazole silane compounds represented by the following chemical formula (I) and chemical formulae (IVa) to (IVc):

[Chem. 7]

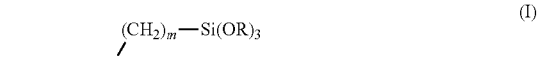
(I)

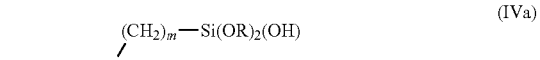
(IVa)

(IVb)

(IVc)

(in the formulae, $X^1$, $X^2$, R, and m have the same meanings as described above.)

That is, the triazole silane compound (I) is a triazole silane compound (trialkoxy body) where n is 0 in the above-described chemical formula (IV).

Similarly, the triazole silane compound represented by the chemical formula (IVa) (hereinafter, also referred to as triazole silane compound (IVa)) is a triazole silane compound where n is 1; the triazole silane compound represented by the chemical formula (IVb) (hereinafter, also referred to as triazole silane compound (IVb)) is a triazole silane compound where n is 2; and the triazole silane compound represented by chemical formula (IVc) (hereinafter, also referred to as triazole silane compound (IVc)) is a triazole silane compound where n is 3.

The triazole silane compounds (IVa) to (IVc) are species generated by hydrolysis of the triazole silane compound (I) present in the surface treatment solution, and they, as well as the triazole silane compound (I) which is a trialkoxy body, are suitable as a component of silane coupling agent. Also, the triazole silane compounds (IVa) to (IVc) can be used after extracting from the surface treatment solution by, for example, removing volatile contents from the surface treatment solution.

In the practice of the present invention, it is preferred to use the triazole silane compound (I) as a raw material for preparing the surface treatment solution.

Examples of the triazole silane compound (I) are as described above.

The surface treatment solution of the present invention is prepared by mixing the triazole silane compound (I) with an organic solvent or the triazole silane compound (I) with a solubilizing agent and water. Examples of the solubilizing agent include acids, alkalis and organic solvents. One kind of these solubilizing agents may be used alone, or two or more kinds thereof may be used in combination.

As to the preparation method of the surface treatment solution in the case where a solubilizing agent and water are used, the solubilizing agent may be added after mixing the triazole silane compound with water, a mixed solution of water and the solubilizing agent may be added to the triazole silane compound, or water may be added after mixing the triazole silane compound with the solubilizing agent.

As the water used for the preparation of the surface treatment solution, pure water such as ion-exchanged water or distilled water is preferred.

Examples of the acid include: mineral acids such as hydrochloric acid, sulfuric acid and nitric acid; organic acids such as formic acid, acetic acid, propionic acid, butyric acid, 2-ethylbutyric acid, valeric acid, caproic acid, enanthic acid, caprylic acid, pelargonic acid, capric acid, lauric acid, myristic acid, palmitic acid, margaric acid, oleic acid, stearic acid, glycolic acid, lactic acid, gluconic acid, glyceric acid, malonic acid, succinic acid, levulinic acid, benzoic acid, oxalic acid, tartaric acid, malic acid, and amino acids; and the like. One kind of these acids may be used alone, or two or more kinds thereof may be used in combination.

Examples of the alkali include: hydroxides of alkali metals such as sodium hydroxide and potassium hydroxide; amines such as ammonia, methylamine, dimethylamine, trimethylamine, ethylamine, diethylamine, triethylamine, propylamine, isopropylamine, butylamine, pentylamine, hexylamine, heptylamine, octylamine, nonylamine, allylamine, ethylenediamine, diethylenetriamine, triethylenetetramine, monoethanolamine, diethanolamine, triethanolamine, monopropanolamine, dipropanolamine, tripropanolamine, monoisopropanolamine, diisopropanolamine, triisopropanolamine, 2-amino-1-propanol, N,N-dimethylethanolamine, cyclohexylamine, aniline, pyrrolidine, piperidine, piperazine, and pyridine; and the like. One kind of these alkalis may be used alone, or two or more kinds thereof may be used in combination.

Examples of the organic solvent include: methanol, ethanol, 1-propanol, 2-propanol, butanol, tert-butyl alcohol, ethylene glycol, propylene glycol, 1,4-butanediol, glycerin, diethylene glycol, triethylene glycol, ethylene glycol monomethyl ether, ethylene glycol dimethyl ether, ethylene glycol monoethyl ether, ethylene glycol diethyl ether, ethylene glycol monobutyl ether, propylene glycol monomethyl ether, propylene glycol monoethyl ether, propylene glycol monobutyl ether, diethylene glycol monomethyl ether, diethylene glycol dimethyl ether, diethylene glycol monoether ether, diethylene glycol diethyl ether, diethylene glycol monobutyl ether, triethylene glycol dimethyl ether, triethylene glycol diethyl ether, tetrahydrofurfuryl alcohol, furfuryl alcohol, acetone, tetrahydrofuran, dioxane, acetonitrile, 2-pyrrolidone, formamide, dimethylformamide, dimethylacetamide, dimethyl sulfoxide, sulfolane, dimethyl carbonate, ethylene carbonate, N-methylpyrrolidone, γ-butyrolactone, 1,3-dimethyl-2-imidazolidinone, and the like. One kind of these organic solvents may be used alone, or two or more kinds thereof may be used in combination.

The content of the solubilizing agent is preferably 0.1 to 50% by weight in the surface treatment solution. In the case where the content of the solubilizing agent is 0.1% by weight or more, the action of enhancing the solubility of the triazole silane compound in the surface treatment solution is remarkable. Moreover, since exceeding 50% by weight is not economical, it is preferable to make 50% by weigh an upper limit. The content of the solubilizing agent is more preferably 0.5% by weight or more and still preferably 1% by weight or more, and more preferably 30% by weight or less and still more preferably 20% by weight or less, in the surface treatment solution.

<Hydrolysis of Triazole Silane Compound>

The triazole silane compound (I) of the present invention is hydrolyzed upon contact with water as described above, and an embodiment of the hydrolysis is shown in the scheme (B).

The scheme (B) indicates an embodiment where the silyl group included in the triazole silane compounds (I), (IVa) and (IVb) is hydrolyzed, that is, an embodiment where the trialkoxysilyl group is progressively changed to a dialkoxyhydroxysilyl group, a dihydroxyalkoxysilyl group, and trihydroxysilyl group.

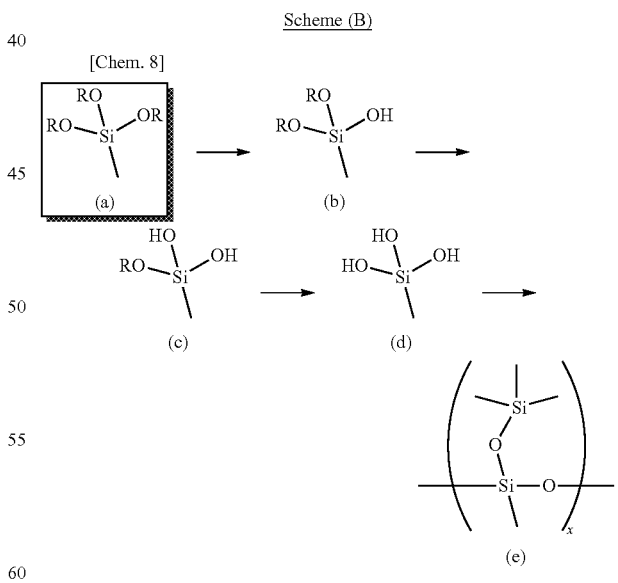

Scheme (B)

In general, it is known that a substance having an alkoxysilyl group in its molecule acts as a silane coupling agent.

For instance, when the bonding between copper and a resin material is cited as an example, the triazole silane compound used in the practice of the present invention has a triazole ring and an alkoxysilyl group (—Si—OR) in the molecule thereof and the triazole ring interacts with the resin and copper to form a chemical bond.

Also, the alkoxysilyl group is subjected to hydrolysis to be converted into a hydroxysilyl group (—Si—OH) and the hydroxysilyl group chemically bonds to copper oxide dotting on the surface of copper.

Therefore, when the surface treatment solution is brought into contact with copper, a chemical film derived from the triazole silane compound (IV) is formed due to the bonding of the triazole ring and hydroxysilyl group on the surface of the copper. And in the case where a resin layer composed of a resin material is formed on the surface of the chemical film, the bonding property between the copper and the resin material can be enhanced in comparison with the case of directly forming the rein layer on the surface of copper.

In the practice of the present invention, the concentration of the triazole silane compound (IV) in the surface treatment solution is preferably from 0.001 to 10% by weight, and more preferably from 0.01 to 5% by weight, calculated in terms of the concentration of the triazole silane compound (I) which is a trialkoxy body.

In the case where the concentration is less than 0.001% by weight, the effect of improving the bonding property is not sufficient, whereas in the case where the concentration exceeds 10% by weight, the effect of improving the bonding property becomes almost plateau and it is not economical to further increase the amount of the triazole silane compound used.

By the way, the triazole silane compounds (IVa) to (IVc) having a hydroxysilyl group, generated in the surface treatment solution gradually react with each other to cause dehydration condensation, and the hydroxysilyl groups form a siloxane bond (Si—O—Si) (see the scheme (B)) thereby being converted into a hardly water-soluble silane oligomer (triazole silane compound having a group represented by chemical formula (e) in the scheme (B)). Incidentally, x of the group represented by chemical formula (e) is an integer denoting the number of the repeating units.

When the amount of the silane oligomer generated in the surface treatment solution becomes large, there is a possibility that the insoluble matter precipitates (the treatment solution becomes white turbid) and adheres to a treatment tank, pipes connected to the treatment tank, and sensors for detecting the temperature and liquid level of the treatment solution, which are immersed in the treatment solution, to thereby inhibit smooth surface treatment.

In order to avoid this, in the preparation of the surface treatment solution, it is preferred to incorporate an organic solvent into the surface treatment solution, as a solubilizing agent for the hardly water-soluble silane oligomer. In addition, in the preparation of the surface treatment solution, an acid or an alkali is preferably incorporated in order to accelerate the dissolution of the triazole silane compound. Incidentally, since the organic solvent also has a function of enhancing the solubility of the triazole silane compound, it is preferable to incorporate at least one kind selected from the group consisting of acids, alkalis, and organic solvents as a solubilizing agent into the surface treatment solution of the present invention.

Similarly, a substance generating a halogen ion such as a chlorine ion, a bromine ion or an iodine ion or a metal ion such as a copper ion, an iron ion or a zinc ion can be used in order to improve the stability of the surface treatment solution and the uniformity of the chemical film.

Also, a known coupling agent may be used in combination as long as the effect of the present invention is not impaired. Examples of the known coupling agent include silane coupling agents having a thiol group (mercapto group), a vinyl group, an epoxy group, a (meth)acrylic group, an amino group, a chloropropyl group, or the like.

Examples of such a silane coupling agent include:
mercaptosilane compounds such as 3-mercaptopropyltrimethoxysilane and 3-mercaptopropylmethyldimethoxysilane;
vinylsilane compounds such as vinyltrichlorosilane, vinyltrimethoxysilane and vinyltriethoxysilane;
styrylsilane compounds such as p-styryltrimethoxysilane;
epoxysilane compounds such as 2-(3,4-epoxycyclohexyl) ethyltrimethoxysilane, 3-glycidoxypropyltrimethoxysilane, 3-glycidoxypropylmethyldiethoxysilane, and 3-glycidoxypropyltriethoxysilane;
acryloxysilane compounds such as 3-acryloxypropyltrimethoxysilane;
methacryloxysilane compounds such as 3-methacryloxypropylmethyldimethoxysilane, 3-methacryloxypropyltrimethoxysilane, 3-methacryloxypropylmethyldiethoxysilane, and 3-methacryloxypropyltriethoxysilane;
aminosilane compounds such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, and N-(vinylbenzyl)-2-aminoethyl-3-aminopropyltrimethoxysilane;
ureidosilane compounds such as 3-ureidopropyltriethoxysilane;
chloropropylsilane compounds such as 3-chloropropyltrimethoxysilane;
sulfide silane compounds such as bis(triethoxysilylpropyl) tetrasulfide; and
isocyanatosilane compounds such as 3-isocyanatopropyltriethoxysilane; and the like.

In addition, aluminum-based coupling agents, titanium-based coupling agents, zirconium-based coupling agents, and the like can also be exemplified.

(Treatment Method)

The method for bringing the surface treatment solution of the present invention into contact with a surface of a base material is not particularly limited, and a means such as spraying, immersion or coating can be adopted in the same manner as in the case of the silane coupling agent described above.

The time (treatment time) for contacting the surface treatment solution with a base material is preferably from one second to 10 minutes and more preferably from 5 seconds to 3 minutes. In the case where the treatment time is less than one second, a film thickness of the chemical film formed on the surface of base material is thin and the bonding force between the materials different in the quality of material cannot be sufficiently obtained, whereas even when the time is longer than 10 minutes, no significant difference in the film thickness of the chemical film is observed and also the improvement in the bonding property cannot be expected.

Also, the temperature of the surface treatment solution when bringing the surface treatment solution into contact with the surface of a base material is preferably from 5 to 50° C., and it can be appropriately set according to the relation with the treatment time described above.

After bringing the surface treatment solution of the present invention into contact with a base material, drying may be performed after washing with water or drying may be performed without washing with water.

The drying is preferably performed at a temperature of from room temperature to 150° C.

The water used for the washing with water is preferably pure water such as ion-exchanged water or distilled water. The method for the washing with water and its time are not particularly limited and it may be performed by means of spraying, immersion or the like, for an appropriate time.

In the present invention, the surface of the chemical film may be modified by treating the dried chemical film with plasma, laser, ion beam, ozone, heating, humidification, or the like. Alternatively, the metal surface may be cleaned for the purpose of removing resin/ion residue, by using plasma, laser, ion beam, mechanical polishing such as pumice brush, or processing with drill or the like.

Prior to bringing the surface treatment solution of the present invention into contact with a surface of copper or a copper alloy (hereinafter, the both are also simply refer to as copper), at least one pre-treatment selected from an acid-pickling treatment, an alkali treatment, a roughening treatment, a heat-resistant treatment, a rust prevention treatment, and a chemical conversion treatment may be performed on the surface of the copper.

The acid-pickling treatment is carried out in order to remove an oil component attached to the surface of copper and in order to remove an oxide film on the surface of copper. For this acid-pickling treatment, use can be made of solutions such as a hydrochloric acid-based solution, a sulfuric acid-based solution, a nitric acid-based solution, a sulfuric acid-hydrogen peroxide-based solution, an organic acid-based solution, an inorganic acid-organic solvent-based solution, and an organic acid-organic solvent-based solution.

The alkali treatment is carried out in order to remove oil and fat components attached to the surface of copper and in order to remove the residue of a previous step (e.g., a dry film resist for forming a copper circuit). For this alkali treatment, use can be made of solutions, for example, aqueous solutions containing an alkali metal hydroxide such as sodium hydroxide or potassium hydroxide, an amine such as ammonia, ethanolamine, monopropanolamine, or tetramethylammonium hydroxide, sodium carbonate, sodium hydrogen carbonate, potassium carbonate, potassium hydrogen carbonate, ammonium carbonate, ammonium hydrogen carbonate, sodium acetate, potassium acetate, sodium phosphate, disodium hydrogen phosphate, potassium phosphate, dipotassium hydrogen phosphate, or the like; organic solvent-based solutions; and the like.

The roughening treatment is performed in order to enhance the bonding property between copper and a resin due to the anchor effect, and the surface of copper is provided with an uneven shape, whereby the adhesion property between the copper and a resin material can be enhanced. In this roughening treatment, use can be made of methods such as micro etching method, electroplating method, electroless plating method, oxidation method (black oxide, brown oxide), oxidation/reduction method, brush polishing method, and jet scrub method.

In the micro-etching method, for example, use can be made of etching agents of organic acid-cupric ion type, sulfuric acid-hydrogen peroxide type, persulfate type, copper chloride type, and iron chloride type. In the electroplating method, unevenness is formed on the surface of copper by depositing fine copper particles on the surface of copper.

In the heat resistance treatment, a film of at least one selected from nickel, nickel-phosphorus, zinc, zinc-nickel, copper-zinc, copper-nickel, copper-nickel-cobalt, and nickel-cobalt is formed on the surface of copper. The formation of this film can be carried out by using a known method by electroplating, but it is not limited to electroplating, and there is no problem even if vapor deposition or other means is used.

The rust prevention treatment is carried out in order to prevent oxidative corrosion of the copper surface, and use can be made of a method of forming a plated film of zinc or a zinc alloy composition or a plated film of electrolytic chromate on the copper surface. Furthermore, a treatment solution containing an organic compound-based rust inhibitor such as a benzotriazole-based rust inhibitor may be brought into contact with the surface of copper.

In the chemical conversion treatment, use can be made of a method of forming a passive film of tin or a method of forming a passive film of copper oxide.

Prior to bringing the surface treatment solution of the present invention into contact with a surface of copper, an aqueous solution containing a copper ion may be brought into contact with the surface of copper. The aqueous solution containing a copper ion has a function of making the thickness of the chemical film formed on the surface of copper uniform.

The copper ion source in the aqueous solution containing a copper ion is not particularly limited as long as it is a water-soluble copper salt, and examples thereof include copper salts such as copper sulfate, copper nitrate, copper chloride, copper formate, and copper acetate. In order to solubilize the copper salt in water, ammonia, hydrochloric acid or the like may be added.

After bringing the surface treatment solution of the present invention into contact with the surface of copper, an aqueous acidic solution or an aqueous alkaline solution may be brought into contact with the surface of copper. Similar to the aqueous solution containing a copper ion described above, the aqueous acidic solution and the aqueous alkaline solution also have a function of making the thickness of the chemical film formed on the surface of copper uniform.

The aqueous acidic solution and the aqueous alkaline solution are not particularly limited. Examples of the aqueous acidic solution include: aqueous solutions containing a mineral acid such as sulfuric acid, nitric acid or hydrochloric acid; aqueous solutions containing an organic acid such as formic acid, acetic acid, lactic acid, glycolic acid, or an amino acid; and the like. Examples of the aqueous alkaline solution include: aqueous solutions containing an alkali metal hydroxide such as sodium hydroxide or potassium hydroxide, an amine such as ammonia, ethanolamine, monopropanolamine, or tetramethylammonium hydroxide, sodium carbonate, sodium hydrogen carbonate, potassium carbonate, potassium hydrogen carbonate, ammonium carbonate, ammonium hydrogen carbonate, sodium acetate, potassium acetate, sodium phosphate, disodium hydrogen phosphate, potassium phosphate, dipotassium hydrogen phosphate, or the like.

Prior to bringing the surface treatment solution of the present invention into contact with the surface of copper, an aqueous solution containing a known coupling agent may be brought into contact with the surface of copper.

After the surface treatment solution of the present invention is brought into contact with the surface of copper, an aqueous solution containing a known coupling agent may be brought into contact with the surface of copper.

After the surface treatment solution of the present invention is brought into contact with the surface of copper, for example, a treatment solution containing a known organic compound-based rust inhibitor such as a benzotriazole-based rust inhibitor may be brought into contact therewith.

The surface treatment solution of the present invention can be used for treating a surface of at least one base material selected from the group consisting of the metal, inorganic material and resin material described above. In the case where the surface of the base material is treated by using the surface treatment solution of the present invention, a chemical film is formed on the surface of the base material and thus the bonding property to other materials can be enhanced.

According to the present invention, two materials selected from the group consisting of the metal, inorganic material and resin material described above can be bonded by using the surface treatment solution of the present invention. In the case where two materials are bonded to each other through a layer of the chemical film formed by the surface treatment solution of the present invention, the mutual affinity can be enhanced, so that even materials different in the quality of material can be more firmly bonded.

(Bonding Method)

As to the bonding method, it can be conducted by a known method. Examples thereof include a method in which the surface treatment solution of the present invention is brought into contact with a surface of a base material composed of metal, an inorganic material or a resin material to form a chemical film, and another base material is bonded to a part or whole of the formed chemical film by using means such as coating, pressure bonding or mixing, by utilizing an adhesive or an adhesive sheet (film), or by a combination of these means.

Also, there may be mentioned a method in which the surface treatment solution of the present invention is brought into contact with surfaces of two base materials selected from metal, an inorganic material and a resin material to form a chemical film on each of the surfaces of the two base materials, and the two base materials are bonded by using means such as coating, pressure bonding or mixing, by utilizing an adhesive or an adhesive sheet (film), or by a combination of these means.

By using the surface treatment solution of the present invention, two materials, in particular, two materials different in the quality of material as described above, can be bonded to each other, so that it can be suitably utilized in various electric or electronic components and electronic devices such as a semiconductor wafer or a printed wiring board.

In the present invention, the surface treatment solution of the present invention can be suitably used to a base material formed of a metal, particularly, copper or a copper alloy. For example, it is suitable for surface treatment of cupper or a copper alloy for the purpose of enhancing bonding property (adhesion property) between a copper circuit (copper wiring layer (copper interconnection layer)) and a semi-cured or cured prepreg or solder resist or a semi-cured or cured dry film resist (insulating resin layer), and the bonding property between the copper wiring layer and the insulating resin layer can be enhanced in the printed wiring board having the insulating resin layer adjacent to the copper wiring layer.

In an application example in a semiconductor wafer, it is suitable for a surface treatment of a semiconductor circuit for the purpose of enhancing bonding property (adhesion property) between a semiconductor circuit formed on the semiconductor wafer and a protective film, for example, an insulating protective film such as a buffer coat or a bump protective film.

In addition, it is also suitable in a package substrate (WL-CSP) for forming a redistribution layer on a semiconductor wafer, for a surface treatment of a copper circuit redistribution layer for the purpose of enhancing bonding property (adhesion property) between the copper circuit redistribution layer and an insulating material.

Examples of the protective film and the insulating material include polyimide resins, polybenzoxazole resins, silicone resins, and the like.

The printed wiring board can be produced by bringing the surface treatment solution of the present invention into contact with a surface of the copper wiring, followed by washing with water and drying, and then forming an insulating resin layer on the surface of the copper wiring. The contact method is the same as mentioned above, and immersion of the copper wiring in the surface treatment solution, spraying of the treatment solution to the copper wiring and the like are preferred because of simplicity and certainty.

Also, the method for washing with water is not particularly limited, and immersion of the copper wiring in washing water or spraying of washing water to the copper wiring surface is preferred because of simplicity and certainty.

For the formation of the insulating resin layer, a known method, for example, a method of sticking a semi-cured resin material or a means of coating a liquid resin material containing a solvent can be adopted. Subsequently, a via-hole is formed in order to conduct the upper and lower wirings. By repeating this process, a multilayer printed wiring board can be produced.

In the circuit formation method of the printed wiring board described above, an example of a semi-additive method using the surface treatment solution of the present invention will be described below.

In a method for producing a circuit substrate including at least one or more of:

(a) a step of preparing an insulating substrate having a first conductive layer on a first surface of an insulating substrate or of an insulating substrate having a through-hole and a via-hole, on a second surface opposite to the first surface, and on the inner walls of the through-hole and the via-hole, (b) a step of forming a photocrosslinkable resin layer and a mask layer on the first surface and the second surface to cover the first conductive layer on the first surface, on the second surface and on the inner walls of the through-hole and the via-hole with the photocrosslinkable resin layer and the mask layer, (c) a step of pattern-exposing the photocrosslinkable resin layer on the first surface, on the second surface and in the vicinity of the through-hole and the via-hole, (d) a step of removing the mask layer on the first surface, on the second surface and in the vicinity of the through-hole and the via-hole, (e) a step of developing and removing uncured photocrosslinkable resin layer on the first surface, on the second surface and in the vicinity of the through-hole and the via-hole by using a photocrosslinkable resin layer-removing solution to expose the first conductive layer on the first surface, the first conductive layer on the second surface and the first conductive layer in the vicinity of the through-hole and the via-hole, (f) a step of forming a second conductive layer on the first conductive layer exposed on the first surface, on the second surface and on the inner walls of the through-hole and the via-hole by an electrolytic plating treatment, (g) a step of removing the cured photocrosslinkable resin layer on the first surface, on the second surface and in the vicinity of the through-hole and the via-hole, to expose the first and second conductive layers on the first surface, on the second surface and on the inner walls of the through-hole and the via-hole, (h) a step of removing the exposed first conductive layer by flash etching,
(i) a step of forming a third conductive layer on the first and second conductive layers on the first surface, on the second surface and on the inner walls of the through-hole and the via-hole by electroless plating and electrolytic plating treatment, and
(j) a step of laminating an insulating resin layer on the first, second and third conductive layers on the first surface, on the second surface and on the inner walls of the through-hole and the via-hole, the surface treatment solution of the present invention is brought into contact with at least one or more metal layers or resist layers among the first, second and third conductive layers on the first surface, on the second surface and on the inner walls of the through-hole and the via-hole, the insulating resin substrate, the photocrosslinkable resin layers used in the etching resist layer and the plating resist layer, and the insulating resin laminate, to thereby produce a printed wiring board.

Furthermore, in the circuit formation method of the printed wiring board described above, an example of a subtractive method using the surface treatment solution of the present invention will be described below.

In a method for producing a circuit substrate including at least one or more of:
(a) a step of preparing an insulating substrate having a first conductive layer on a first surface of an insulating substrate or of an insulating substrate having a through-hole and a via-hole, on a second surface opposite to the first surface, and on the inner walls of the through-hole and the via-hole,
(b) a step of forming a photocrosslinkable resin layer and a mask layer on the first surface and the second surface to cover the first conductive layer on the first surface, on the second surface and on the inner walls of the through-hole and the via-hole with the photocrosslinkable resin layer and the mask layer,
(c) a step of pattern-exposing the photocrosslinkable resin layer on the first surface, on the second surface and in the vicinity of the through-hole and via-hole,
(d) a step of removing the mask layer on the first surface, on the second surface and in the vicinity of the through-hole and the via-hole,
(e) a step of developing and removing uncured photocrosslinkable resin layer on the first surface, on the second surface and in the vicinity of the through-hole and the via-hole by using a photocrosslinkable resin layer-removing solution to expose the first conductive layer on the first surface, the first conductive layer on the second surface and the first conductive layer in the vicinity of the through-hole and the via-hole,
(f) a step of etching and removing the first conductive layer exposed on the first surface, on the second surface and on the inner walls of the through-hole and the via-hole,
(g) a step of removing the cured photocrosslinkable resin layer on the first surface, on the second surface and in the vicinity of the through-hole and the via-hole, to expose the first and second conductive layers on the first surface, on the second surface and on the inner walls of the through-hole and the via-hole,
(h) a step of forming a third conductive layer on the first and second conductive layers on the first surface, on the second surface and on the inner walls of the through-hole and the via-hole by electroless plating and electrolytic plating treatment, and
(i) a step of laminating an insulating resin layer on the first, second and third conductive layers on the first surface, on the second surface and on the inner walls of the through-hole and the via-hole, the surface treatment solution of the present invention is brought into contact with at least one or more metal layers or resist layers among the first, second and third conductive layers on the first surface, on the second surface and on the inner walls of the through-hole and the via-hole, the insulating resin substrate, the photocrosslinkable resin layers used in the etching resist layer and the plating resist layer, and the insulating resin laminate, to thereby produce a printed wiring board.

The copper wiring and the conductive layers may be those produced by any method such as an electroless plating method, an electrolytic plating method, a vapor deposition method, a sputtering method, or a damascene method, and may contain an inner via-hole, a through-hole, a connection terminal or the like.

The "copper" according to the present invention is one used in the usage and form, such as a foil (electrolytic copper foil, rolled copper foil, resin-attached copper foil, carrier-attached copper foil, electroless copper foil, sputtered copper foil, or thin copper foil), a plating film (electroless copper-plating film or electrolytic copper-plating film), a thin film formed by a vapor deposition method, a sputtering method, a damascene method or the like, a grain, a needle, a fiber, a wire, a rod, a tube, a plate, or the like, which are used in electronic devices such as a printed wiring board and a lead frame, an ornament, a building material, or the like. In the case of a recent copper wiring through which a high frequency electric signal flows, it is preferred that the surface of copper is a smooth surface having an average roughness of 0.1 µm or less. The surface of copper may be plated with nickel, zinc, chromium, tin, or the like as a pretreatment.

Furthermore, the carrier-attached copper foil to be treated with the surface treatment solution of the present invention is an ultrathin electrolytic copper foil used for a printed wiring board including a step of forming a circuit by any method of a semi-additive method, a subtractive method, a partly additive method, and a modified semi-additive method, and contains a copper foil carrier, a peeling layer laminated on the copper foil carrier, and an ultrathin copper layer laminated on the peeling layer. The surface of copper may be subjected to at least one pretreatment selected from the group consisting of an acid-pickling treatment, a roughening treatment, a heat resistance treatment, a rust prevention treatment, and a chemical conversion treatment.

(Insulating Composition)

An insulating composition can be formed by incorporating the silane coupling agent according to the present invention into a resin material or an inorganic material.

Also, an insulating composition can be obtained by dissolving the triazole silane compound (IV) in an organic solvent or the like and mixing it with a resin material or an inorganic material.

The content of the triazole silane compound (IV) in the insulating composition is preferably from 0.001 to 10% by weight, and more preferably from 0.01 to 5% by weight. In the case where the content of the triazole silane compound (IV) is less than 0.001% by weight in the insulating composition, the effect of improving the bonding property is not sufficient, whereas in the case where the concentration exceeds 10% by weight, the effect of improving the bonding property becomes almost plateau and it is not economical to further increase the amount of the triazole silane compound (IV) used.

The insulating composition can be produced by a known method. For example, the insulating composition can be produced by dissolving the triazole silane compound (IV) in an organic solvent and mixing it with a solid or liquid resin material. Also, the triazole silane compound (IV) may be directly added to and mixed with a liquid resin material to produce the insulating composition.

The insulating composition according to the present invention provides an insulating material having high bonding strength so that it can be suitably used in various electric or electronic components and electronic devices such as a printed wiring board.

By the way, JP-A-2009-19266 discloses an invention relating to a method for forming a film of silane coupling agent, which includes a step of coating a liquid containing a silane coupling agent on a metal surface, a step of drying the metal surface coated with the liquid at a temperature of from 25 to 150° C. for 5 minutes or shorter time, and a step of washing with water the metal surface dried.

Also, it is described that on the metal surface, an adhesive metal layer, such as tin, may be previously formed with an immersion plating solution, as a surface treatment.

The surface treatment solution of the present invention can be used as the liquid containing a silane coupling agent described above. The contents described in the patent publication are incorporated by reference as a part of the specification.

Example

The present invention will be described specifically with reference to Examples (Synthesis tests, Evaluation tests), but the present invention should not be construed as being limited thereto.

Raw material triazole compounds and halogenated alkylsilane compounds used in the synthesis tests are as follows.

[Triazole Compound]
3,5-diamino-1,2,4-triazole: manufactured by Tokyo Chemical Industry Co., Ltd.
3,5-dimethyl-1,2,4-triazole: the same as above
3-phenyl-1,2,4-triazole: synthesized in accordance with the method described in "J. Org. Chem. vol. 44, p. 4160 (1979)".
3-amino-5-methylthio-1,2,4-triazole: manufactured by Tokyo Chemical Industry Co., Ltd.
5-methyl-3-octyl-1,2,4-triazole: synthesized in accordance with the method described in U.S. Pat. No. 5,098,920.
3-amino-1,2,4-triazole: manufactured by Tokyo Chemical Industry Co., Ltd. [Halogenated alkylsilane compound]
3-chloropropyltrimethoxysilane: manufactured by Shin-Etsu Chemical Co., Ltd.
3-chloropropyltriethoxysilane: manufactured by Tokyo Chemical Industry Co., Ltd.
6-bromohexyltriethoxysilane: synthesized in accordance with the method described in "Tetrahedron, vol. 63, p. 5076 (2007)".

The triazole silane compound used in Comparative Example 1 (evaluation test) is as follows.

[Triazole Silane Compound]
1-[3-(trimethoxysilyl)propyl]-1,2,4-triazole: synthesized in accordance with the method described in Patent Literature 2.

The test method of the bonding property between copper and a resin, which was adopted as an evaluation test of silane coupling agents, is explained below.

[Test of Bonding Property]
(1) Test Piece
As the test piece, an electrolytic copper foil (thickness: 35 μm) was used.
(2) Treatment of Test Piece
Performed according to the following steps a and b
a: Acid cleaning/1 min. (room temperature), washing with water, and drying/1 min. (100° C.)
b: Immersion/1 min. (room temperature) in a surface treatment solution of each of Examples and Comparative Examples, washing with water, and drying/1 min. (100° C.)
(3) Bonding of Resin to Test Piece
On S surface (glossy surface) of the test piece treated was laminated and pressed a glass fabric epoxy resin-impregnated prepreg (FR-4 grade) to bond the resin on the test piece.
(4) Evaluation of Bonding Property
A test piece having a width of 10 mm was prepared according to "JIS C6481 (1996)" and subjected to a pressure cooker treatment (121° C./100% humidity/100 hours), and then a peel-off strength (kN/m) of the copper foil was measured.

Example 1

Synthesis of 3,5-diamino-1-[3-(trimethoxysilyl)propyl]-1,2,4-triazole

To a suspension consisting of 15.0 g (0.151 mol) of 3,5-diamino-1,2,4-triazole and 100 mL of dehydrated N,N-dimethylformamide was added 29.2 g (0.151 mol) of a 28% sodium methoxide methanol solution at room temperature to form a uniform solution, followed by stirring for 30 minutes. Thereafter, thereto was added 30.1 g (0.151 mol) of 3-chloropropyltrimethoxysilane, followed by stirring at 77 to 80° C. for 4 hours.

After the reaction mixture in the form of suspension was cooled to 3° C., insoluble matter was removed by filtration, and the solvent in the filtrate was evaporated under reduced pressure, to thereby obtain 35.7 g (0.137 mol, 90.5% yield) of a brown viscous substance.

$^1$H-NMR spectrum data of the obtained viscous substance were as follows.

$^1$H-NMR (DMSO-$d_6$) δ: 0.51 (t, 2H), 1.62 (m, 2H), 3.46 (s, 9H), 3.58 (t, 2H), 4.69 (s, 2H), 5.11 (s, 2H).

From the $^1$H-NMR spectrum data, the obtained viscous substance was identified to be the titled triazole silane compound represented by the chemical formula (V).

[Chem. 9]

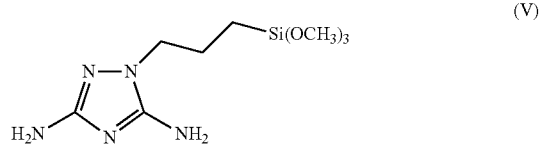

(V)

Example 2

Synthesis of 3,5-diamino-1-[3-(triethoxysilyl)propyl]-1,2,4-triazole

To a suspension consisting of 15.6 g (0.157 mol) of 3,5-diamino-1,2,4-triazole and 100 mL of dehydrated N,N- dimethylformamide was added 53.5 g (0.157 mol) of a 20% sodium ethoxide ethanol solution at room temperature, and the whole was heated to 55 to 60° C. and stirred for 20 minutes. Thereafter, thereto was added 37.9 g (0.157 mol) of 3-chloropropyltriethoxysilane, followed by stirring at 87 to 90° C. for 6 hours.

After the reaction mixture in the form of suspension was cooled to 3° C., insoluble matter was removed by filtration, and the solvent in the filtrate was evaporated under reduced pressure, to thereby obtain 42.3 g (0.139 mol, 88.8% yield) of a brown viscous substance.

$^1$H-NMR spectrum data of the obtained viscous substance were as follows.

$^1$H-NMR (DMSO-d$_6$) δ: 0.49 (t, 2H), 1.14 (t, 9H), 1.62 (m, 2H), 3.56 (t, 2H), 3.73 (q, 6H), 4.67 (s, 2H), 5.11 (s, 2H).

From the $^1$H-NMR spectrum data, the obtained viscous substance was identified to be the titled triazole silane compound represented by the chemical formula (VI).

[Chem. 10]

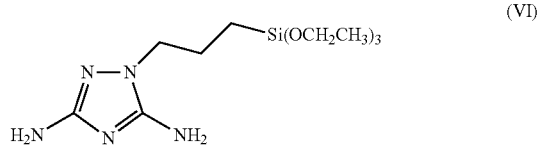

(VI)

Example 3

Synthesis of 3,5-dimethyl-1-[3-(trimethoxysilyl)propyl]-1,2,4-triazole

To a solution consisting of 10.5 g (0.108 mol) of 3,5-dimethyl-1,2,4-triazole and 60 mL of dehydrated N,N-dimethylformamide was added 20.7 g (0.107 mol) of a 28% sodium methoxide methanol solution at room temperature, followed by stirring for 20 minutes. Thereafter, thereto was added 21.6 g (0.109 mol) of 3-chloropropyltrimethoxysilane, followed by stirring at 90 to 93° C. for 4 hours.

After the reaction mixture in the form of suspension was cooled to 2° C., insoluble matter was removed by filtration, subsequently the solvent in the filtrate was evaporated under reduced pressure, and a small amount of insoluble matter formed was removed by filtration, to thereby obtain 24.6 g (0.095 mol, 87.8% yield) of a slightly brown liquid.

$^1$H-NMR spectrum data of the obtained liquid were as follows.

$^1$H-NMR (DMSO-d$_6$) δ: 0.54 (t, 2H), 1.76 (m, 2H), 2.15 (s, 3H), 2.31 (s, 3H), 3.47 (s, 9H), 3.94 (t, 2H).

From the $^1$H-NMR spectrum data, the obtained liquid was identified to be the titled triazole silane compound represented by the chemical formula (VII).

[Chem. 11]

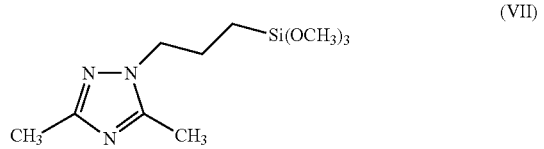

(VII)

Example 4

Synthesis of 3-phenyl-1-[3-(trimethoxysilyl)propyl]-1,2,4-triazole

To a solution consisting of 17.4 g (0.120 mol) of 3-phenyl-1,2,4-triazole and 90 mL of dehydrated N,N-dimethylformamide was added 23.3 g (0.121 mol) of a 28% sodium methoxide methanol solution at room temperature, followed by stirring for 20 minutes. Thereafter, thereto was added 23.8 g (0.120 mol) of 3-chloropropyltrimethoxysilane, followed by stirring at 88 to 90° C. for 4 hours.

After the reaction mixture in the form of suspension was cooled to 2° C., insoluble matter was removed by filtration, subsequently the solvent in the filtrate was evaporated under reduced pressure, and a small amount of insoluble matter formed was removed by filtration, to thereby obtain 34.2 g (0.111 mol, 92.7% yield) of a slightly pink liquid.

$^1$H-NMR spectrum data of the obtained liquid were as follows.

$^1$H-NMR (DMSO-d$_6$) δ: 0.58 (t, 2H), 1.90 (m, 2H), 3.48 (s, 9H), 4.20 (t, 2H), 7.41-7.48 (m, 2H), 8.01-8.05 (m, 3H), 8.67 (s, 1H).

From the $^1$H-NMR spectrum data, the obtained liquid was identified to be the titled triazole silane compound represented by the chemical formula (VIII).

[Chem. 12]

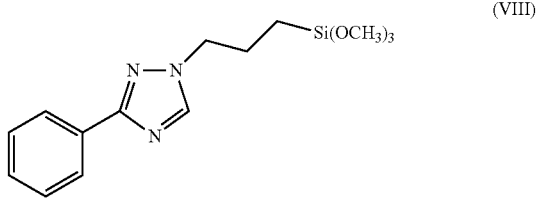

(VIII)

Example 5

Synthesis of 5-amino-3-methylthio-1-[3-(trimethoxysilyl)propyl]-1,2,4-triazole

To a solution consisting of 10.0 g (0.0768 mol) of 3-amino-5-methylthio-1,2,4-triazole and 60 mL of dehydrated N,N-dimethylformamide was added 14.8 g (0.0767 mol) of a 28% sodium methoxide methanol solution at room temperature, followed by stirring for 20 minutes. Thereafter, thereto was added 15.4 g (0.0775 mol) of 3-chloropropyltrimethoxysilane, followed by stirring at 88 to 90° C. for 4 hours.

After the reaction mixture in the form of suspension was cooled to 2° C., insoluble matter was removed by filtration, subsequently the solvent in the filtrate was evaporated under reduced pressure, and a small amount of insoluble matter formed was removed by filtration, to thereby obtain 21.5 g (0.0735 mol, 95.7% yield) of a reddish brown liquid.

$^1$H-NMR spectrum data of the obtained liquid were as follows.

$^1$H-NMR (DMSO-d$_6$) δ: 0.54 (t, 2H), 1.70 (m, 2H), 2.38 (s, 3H), 3.47 (s, 9H), 3.75 (t, 2H).

From the $^1$H-NMR spectrum data, the obtained liquid was identified to be the titled triazole silane compound represented by the chemical formula (IX).

[Chem. 13]

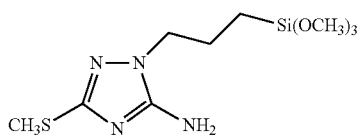

(IX)

Example 6

Synthesis of 5-methyl-3-octyl-1-[3-(trimethoxysilyl)propyl]-1,2,4-triazole

To a solution consisting of 9.0 g (0.0461 mol) of 5-methyl-3-octyl-1,2,4-triazole and 50 mL of dehydrated N,N-dimethylformamide was added 9.00 g (0.0466 mol) of a 28% sodium methoxide methanol solution at room temperature, followed by stirring for 20 minutes. Thereafter, thereto was added 9.26 g (0.0466 mol) of 3-chloropropyltrimethoxysilane, followed by stirring at 90 to 92° C. for 4 hours.

After the reaction mixture in the form of suspension was cooled to 2° C., insoluble matter was removed by filtration, subsequently the solvent in the filtrate was evaporated under reduced pressure, and a small amount of insoluble matter formed was removed by filtration, to thereby obtain 14.3 g (0.0400 mol, 86.8% yield) of a pale brown liquid.

$^1$H-NMR spectrum data of the obtained liquid were as follows.

$^1$H-NMR (DMSO-$d_6$) δ: 0.52 (m, 2H), 0.85 (br s, 3H), 1.1-1.3 (br s, 10H), 1.58 (br s, 2H), 1.75 (m, 2H), 2.16 (s, 3H), 2.62 (t, 2H), 3.46 (s, 9H), 3.94 (t, 2H).

From the $^1$H-NMR spectrum data, the obtained liquid was identified to be the titled triazole silane compound represented by the chemical formula (X).

[Chem. 14]

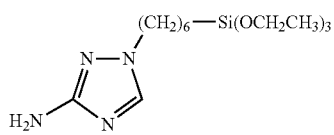

(X)

Example 7

Synthesis of 3-amino-1-[6-(triethoxysilyl)hexyl]-1,2,4-triazole

To a solution consisting of 5.50 g (0.0654 mol) of 3-amino-1,2,4-triazole and 50 mL of dehydrated N,N-dimethylformamide was added 22.3 g (0.0655 mol) of a 20% sodium ethoxide ethanol solution at room temperature, and the whole was heated to 51 to 52° C. and stirred for 20 minutes. Thereafter, thereto was added dropwise 21.3 g (0.0651 mol) of 6-bromohexyltriethoxysilane over 5 minutes, followed by stirring at 78 to 80° C. for 3 hours.

After the reaction mixture in the form of suspension was cooled to 2° C., insoluble matter was removed by filtration and the filtrate was concentrated to 28 g under reduced pressure. Thereto was added 50 mL of diethyl ether, then, insoluble matter was removed by filtration and subsequently the solvent in the filtrate was evaporated under reduced pressure, to thereby obtain 19.8 g (0.0600 mol, 91.6% yield) of a pale brown liquid.

$^1$H-NMR spectrum data of the obtained liquid were as follows.

$^1$H-NMR (CDCl$_3$) δ: 0.61 (t, 2H), 1.22 (t, 9H), 1.2-1.4 (m, 6H), 1.62 (m, 2H), 3.42 (t, 2H), 3.48 (q, 6H), 7.64 (s, 1H).

From the $^1$H-NMR spectrum data, the obtained liquid was identified to be the titled triazole silane compound represented by the chemical formula (XI).

[Chem. 15]

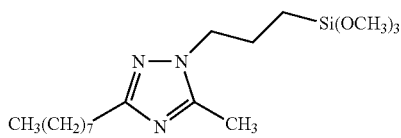

(XI)

Example 8

Synthesis of 3-amino-1-[3-(trimethoxysilyl)propyl]-1,2,4-triazole

To a solution consisting of 20.4 g (0.243 mol) of 3-amino-1,2,4-triazole and 100 mL of dehydrated N,N-dimethylformamide was added 46.7 g (0.242 mol) of a 28% sodium methoxide methanol solution at room temperature, followed by stirring for 30 minutes. Thereafter, thereto was added 48.3 g (0.243 mol) of 3-chloropropyltrimethoxysilane, followed by stirring at 86 to 90° C. for 8 hours.

After the reaction mixture in the form of suspension was cooled to 3° C., insoluble matter was removed by filtration, and the solvent in the filtrate was evaporated under reduced pressure, to thereby obtain 57.6 g (0.234 mol, 96.4% yield) of a yellowish brown liquid.

$^1$H-NMR spectrum data of the obtained liquid were as follows.

$^1$H-NMR (DMSO-$d_6$) δ: 0.51 (t, 2H), 1.73 (m, 2H), 3.46 (s, 9H), 3.86 (t, 2H), 5.21 (s, 2H), 7.91 (s, 1H).

From the $^1$H-NMR spectrum data, the obtained liquid was identified to be the titled triazole silane compound represented by the chemical formula (XII).

[Chem. 16]

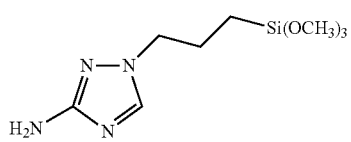

(XII)

Preparation of Surface Treatment Solution for Copper and Test of Bonding Property Example 9

A surface treatment solution for copper was prepared by using the triazole silane compound synthesized in Example 1 as a silane coupling agent component.

That is, to 10 g of the triazole silane compound was added 200 g of ethylene glycol monobutyl ether, subsequently thereto was added 790 g of water, followed by stirring at room temperature for 2 hours, to thereby prepare a surface treatment solution for copper (hereinafter referred to as treatment solution A).

For this treatment solution A, it was confirmed that the trimethoxysilyl group of the triazole silane compound was hydrolyzed into the trihydroxysilyl group, and then the test of bonding property was conducted.

The test results obtained were as shown in Table 1.

Examples 10 to 16

Surface treatment solutions for copper (hereinafter referred to as treatment solutions B, C, D, E, F, G, and H, respectively) were prepared in the same manner as in Example 9 but using the triazole silane compounds synthesized in Examples 2 to 8 instead of the triazole silane compound synthesized in Example 1.

It was confirmed that the trimethoxysilyl group or triethoxysilyl group of the triazole silane compounds in these treatment solutions was hydrolyzed into a trihydroxysilyl group, and then the test of bonding property was conducted.

The test results obtained were as shown in Table 1.

Comparative Example 1

A surface treatment solution for copper (hereinafter referred to as treatment solution I) was prepared in the same manner as in Example 9 but using 1-[3-(trimethoxysilyl)propyl]-1,2,4-triazole instead of the triazole silane compound synthesized in Example 1.

For this treatment solution I, it was confirmed that the trimethoxysilyl group of the triazole silane compound was hydrolyzed into a trihydroxysilyl group, and then the test of bonding property was conducted.

The test results obtained were as shown in Table 1.

Comparative Example 2

A surface treatment solution for copper (hereinafter referred to as treatment solution J) having the same composition as the treatment solution A described above except that no silane coupling agent component was used was prepared, and the test of bonding property was conducted.

The test results obtained were as shown in Table 1.

TABLE 1

|  |  |  | Peeling strength (kN/m) |
|---|---|---|---|
| Example | 9 | Treatment solution A | 0.92 |
|  | 10 | Treatment solution B | 0.91 |
|  | 11 | Treatment solution C | 0.42 |
|  | 12 | Treatment solution D | 0.66 |
|  | 13 | Treatment solution E | 0.65 |
|  | 14 | Treatment solution F | 0.42 |
|  | 15 | Treatment solution G | 0.74 |
|  | 16 | Treatment solution H | 0.74 |
| Comparative | 1 | Treatment solution I | 0.21 |
| Example | 2 | Treatment solution J | 0.17 |

According to the test results shown in Table 1, it is recognized that the surface treatment solution for copper using the triazole silane compound of the present invention, which has a substituent at the 3-position and/or 5-position of the 1,2,4-triazole ring, as a silane coupling agent component exhibits an excellent effect of enhancing the bonding force between copper and the resin.

In particular, in the case of a triazole silane compound having an amino group or a phenyl group, the effect of enhancing the bonding force between copper and the resin is remarkable, and in the case of a triazole silane compound having two amino groups, the above-mentioned bonding force is dramatically improved.

Although the present invention has been described in detail and by reference to specific embodiments, it is apparent to those skilled in the art that it is possible to add various alterations and modifications without departing from the spirit and the scope of the present invention. The present application is based on Japanese Patent Application (No. 2017-077019) filed on Apr. 7, 2017, and the whole contents thereof are incorporated herein by reference. In addition, all references referred herein are entirely incorporated.

INDUSTRIAL APPLICABILITY

Since the triazole silane compound according to the present invention can provide a silane coupling agent to which a function of preventing metal from rust, which is the feature of a triazole compound, and a function of curing an epoxy resin or a urethane resin are added, it is expected to be utilized in a composite material such as a printed wiring board produced by combining a large number of different kinds of materials.

According to the present invention, since the bonding property (adhesion property) of metal, an inorganic material and a resin material can be sufficiently ensured, the surface of a base material can be maintained in a smooth state without roughening it. Therefore, the present invention is able to largely contribute to realization of miniaturization, thickness reduction, higher frequency, higher density, or the like in a multilayer printed wiring board, so that the industrial applicability is great.

The invention claimed is:

1. A triazole silane compound represented by the chemical formula (I):

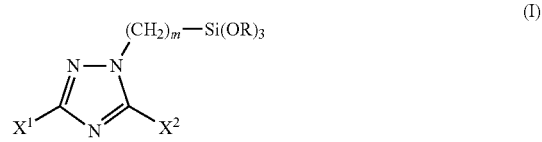

wherein $X^1$ and $X^2$ are the same as or different from each other and each represents a hydrogen atom, a linear or branched alkyl group having a carbon number of 1 to 12, a phenyl group, a benzyl group, an amino group, or an alkylthio group having a carbon number of 1 to 6; m represents an integer of 1 to 12; R represents a methyl group or an ethyl group; provided that the case where $X^1$ and $X^2$ are simultaneously hydrogen atoms is excluded.

2. A synthesis method of the triazole silane compound described in claim 1, comprising reacting a triazole compound represented by the chemical formula (II) with a halogenated alkylsilane compound represented by the chemical formula (III):

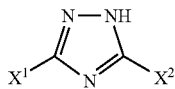

(II)

and

Hal-$(CH_2)_m$—Si$(OR)_3$    (III)

wherein Hal represents a chlorine atom, a bromine atom or an iodine atom.

3. A silane coupling agent comprising a triazole silane compound represented by the following chemical formula (IV) as a component:

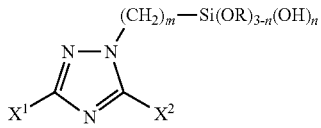

(IV)

wherein $X^1$ and $X^2$ are the same as or different from each other and each represents a hydrogen atom, a linear or branched alkyl group having a carbon number of 1 to 12, a phenyl group, a benzyl group, an amino group, or an alkylthio group having a carbon number of 1 to 6; m represents an integer of 1 to 12; n represents 0 or an integer of 1 to 3; R represents a methyl group or an ethyl group; provided that the case where $X^1$ and $X^2$ are simultaneously hydrogen atoms is excluded.

4. A surface treatment solution comprising a triazole silane compound represented by the following chemical formula (IV):

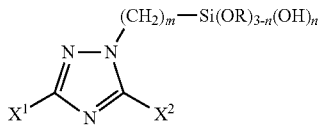

(IV)

wherein $X^1$ and $X^2$ are the same as or different from each other and each represents a hydrogen atom, a linear or branched alkyl group having a carbon number of 1 to 12, a phenyl group, a benzyl group, an amino group, or an alkylthio group having a carbon number of 1 to 6; m represents an integer of 1 to 12; n represents 0 or an integer of 1 to 3; R represents a methyl group or an ethyl group; provided that the case where $X^1$ and $X^2$ are simultaneously hydrogen atoms is excluded.

5. The surface treatment solution according to claim 4, which is used for treating a surface of at least one material selected from the group consisting of a metal, an inorganic material and a resin material.

6. The surface treatment solution according to claim 4, which is used for bonding two materials selected from the group consisting of a metal, an inorganic material and a resin material.

7. A surface treatment method of metal, comprising bringing the surface treatment solution described in claim 4 into contact with a surface of a metal.

8. The surface treatment method of metal according to claim 7,
wherein the metal is copper or a copper alloy, and
the method comprises, before bringing the surface treatment solution into contact with a surface of copper or a copper alloy, bringing an aqueous solution containing a copper ion into contact with the surface of the copper or the copper alloy.

9. The surface treatment method of metal according to claim 7,
wherein the metal is copper or a copper alloy, and
the method comprises, after bringing the surface treatment solution into contact with a surface of copper or a copper alloy, bringing an aqueous acidic solution or an aqueous alkaline solution into contact with the surface of the copper or the copper alloy.

10. A surface treatment method of an inorganic material, comprising bringing the surface treatment solution described in claim 4 into contact with a surface of an inorganic material.

11. A surface treatment method of a resin material, comprising bringing the surface treatment solution described in claim 4 into contact with a surface of a resin material.

12. A bonding method between a metal and a resin material, comprising bringing the surface treatment solution described in claim 4 into contact with at least one of a metal and a resin material to form a chemical film on the at least one of the metal and the resin material, and bonding the metal and the resin material to each other through the chemical film.

13. A bonding method between an inorganic material and a resin material, comprising bringing the surface treatment solution described in claim 4 into contact with at least one of an inorganic material and a resin material to form a chemical film on the at least one of the inorganic material and the resin material, and bonding the inorganic material and the resin material to each other through the chemical film.

14. A bonding method between a metal and an inorganic material, comprising bringing the surface treatment solution described in claim 4 into contact with at least one of a metal and an inorganic material to form a chemical film on the at least one of the metal and the inorganic material, and bonding the metal and the inorganic material to each other through the chemical film.

15. A printed wiring board comprising two materials selected from the group consisting of a metal, an inorganic material and a resin material, bonded through a chemical film formed from the surface treatment solution described in claim 4.

16. A semiconductor wafer comprising two materials selected from the group consisting of a metal, an inorganic material and a resin material, bonded through a chemical film formed from the surface treatment solution described in claim 4.

17. An electronic device comprising two materials selected from the group consisting of a metal, an inorganic material and a resin material, bonded through a chemical film formed from the surface treatment solution described in claim 4.

18. An insulating composition comprising the silane coupling agent described in claim 3 and a resin material or an inorganic material.

19. An insulating material comprising the insulating composition described in claim 18.

20. A printed wiring board comprising an insulating layer obtained from the insulating composition described in claim 18.

21. A semiconductor wafer comprising an insulating layer obtained from the insulating composition described in claim 18.

22. An electronic device comprising an insulating layer obtained from the insulating composition described in claim 18.

* * * * *